United States Patent
Jain et al.

(10) Patent No.: US 10,151,786 B2
(45) Date of Patent: Dec. 11, 2018

(54) ESTIMATING LEAKAGE CURRENTS BASED ON RATES OF TEMPERATURE OVERAGES OR POWER OVERAGES

(71) Applicant: Advanced Micro Devices, Inc., Sunnyvale, CA (US)

(72) Inventors: Ashish Jain, Austin, TX (US); Alexander J. Branover, Chestnut Hill, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 1309 days.

(21) Appl. No.: 14/021,279

(22) Filed: Sep. 9, 2013

(65) Prior Publication Data
US 2015/0073611 A1    Mar. 12, 2015

(51) Int. Cl.
*G01R 31/02* (2006.01)
*G06F 1/20* (2006.01)
*G06F 1/32* (2006.01)

(52) U.S. Cl.
CPC ........... *G01R 31/025* (2013.01); *G06F 1/206* (2013.01); *G06F 1/324* (2013.01); *G06F 1/3296* (2013.01); *Y02B 60/1217* (2013.01); *Y02D 10/126* (2018.01)

(58) Field of Classification Search
None
See application file for complete search history.

(56) References Cited

U.S. PATENT DOCUMENTS

| | | | | |
|---|---|---|---|---|
| 7,689,851 B2* | 3/2010 | Sawyers | ............... | G06F 1/3203 713/320 |
| 2003/0125900 A1* | 7/2003 | Orenstien | ............. | G06F 1/3203 702/132 |
| 2006/0238267 A1* | 10/2006 | Bienek | ..................... | G01K 7/42 331/176 |
| 2007/0001694 A1* | 1/2007 | Jahagirdar | ......... | G01R 31/2891 324/750.3 |
| 2007/0157035 A1* | 7/2007 | Gumma | .................. | G06F 1/206 713/300 |
| 2007/0245161 A1* | 10/2007 | Shaw | .................... | G06F 1/3203 713/300 |
| 2008/0301475 A1* | 12/2008 | Felter | ................... | G06F 1/3203 713/300 |
| 2010/0153954 A1* | 6/2010 | Morrow | .................. | G06F 1/329 718/102 |
| 2013/0046999 A1* | 2/2013 | Jung | ....................... | G06F 1/206 713/300 |
| 2013/0246820 A1* | 9/2013 | Branover | ............. | G06F 1/3296 713/320 |

* cited by examiner

*Primary Examiner* — Jason Lin (57) ABSTRACT

An operating point of one or more components in a processing device may be set using a leakage current estimated based on at least one of a rate of temperature overages or a rate of power overages. In some embodiments, a power management controller may be used to set an operating point of one or more components in the processing device based on at least one of a rate of temperature overages or a rate of power overages for the component(s).

18 Claims, 7 Drawing Sheets

| 91.3 | 91.3 | 91.5 | 91.7 | 91.9 | 92.1 | 92.5 | 92.7 | 92.9 | 93.1 | 93.3 | 93.9 | 93.7 |
|------|------|------|------|------|------|------|------|------|------|------|------|------|
| 91.8 | 92.2 | 92.5 | 92.8 | 93.0 | 93.4 | 93.7 | 93.8 | 93.9 | 94.3 | 94.3 | 94.3 | 93.9 |
| 92.4 | 93.0 | 93.2 | 93.4 | 93.7 | 94.1 | 94.5 | 94.5 | 94.4 | 94.4 | 94.2 | 93.9 | 93.3 |
| 93.1 | 93.9 | 94.1 | 94.3 | 94.5 | 94.8 | 95.1 | 95.1 | 95.1 | 95.0 | 94.7 | 94.1 | 93.3 |
| 93.7 | 94.4 | 94.9 | 95.2 | 95.5 | 95.7 | 95.8 | 95.8 | 95.8 | 95.5 | 95.1 | 94.4 | 93.4 |
| 93.9 | 94.5 | 95.2 | 95.7 | 96.0 | 96.2 | 96.2 | 96.3 | 96.2 | 95.9 | 95.3 | 94.6 | 93.6 |
| 94.3 | 94.7 | 95.4 | 96.1 | 96.5 | 96.6 | 96.7 | 96.7 | 96.6 | 96.2 | 95.5 | 94.6 | 93.9 |
| 94.6 | 95.3 | 95.9 | 96.6 | 97.0 | 97.1 | 97.2 | 97.2 | 97.0 | 96.7 | 96.0 | 95.1 | 94.4 |
| 94.9 | 96.6 | 97.5 | 97.6 | 97.8 | 98.0 | 98.0 | 98.0 | 97.9 | 97.6 | 97.2 | 96.5 | 95.4 |
| 94.5 | 96.9 | 90.4 | 90.8 | 99.0 | 99.1 | 99.2 | 99.2 | 99.1 | 90.9 | 90.6 | 98.0 | 96.5 |

ESTIMATING LEAKAGE CURRENTS BASED ON RATES OF TEMPERATURE OVERAGES OR POWER OVERAGES

BACKGROUND

Field of the Disclosure

The present disclosure relates generally to processing devices and, more particularly, to modifying a temperature value that is used to estimate leakage currents in processing devices.

Description of the Related Art

Processing systems such as a system-on-a-chip (SOC) incorporate multiple components of a processing device onto a single substrate. For example, an SOC such as an accelerated processing unit (APU) may use a single substrate to support and interconnect processing devices such as central processing units (CPUs) and graphics processing units (GPUs), as well as a physical layer interface to external memory and additional logic for controlling operation of the components. The CPUs or GPUs can read instructions or data from the external memory via the physical layer interface, perform operations using the instructions or data, and then write the results back into external memory via the physical layer interface. The total power consumption of an SOC includes the power consumed by operation of the components of the SOC and leakage currents that consume power but are not used to operate the components of the SOC. Leakage currents may consume a significant portion of the total power consumed by the processing device.

Leakage currents are strongly temperature dependent and increase sharply with increasing temperature through the temperature range typically found in processing devices. Consequently, the dynamic power available for operation of the SOC (i.e., the difference between the thermal design power (TDP), and the power consumed by the leakage current) also depends on temperature. In order to set the operating frequencies or operating voltages (e.g., the operating points) of the components of the SOC, the temperature at one or more locations in the SOC is measured or calculated based on the power consumption at the one or more location. The leakage current is then estimated based on the temperatures and used to estimate the available dynamic power for one or more components of the SOC. The one or more operating point of the components can then be set so that the SOC or components draw approximately the available dynamic power.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

In operation, a processing device, such as a system-on-a-chip (SOC), generates significant thermal gradients across the substrate used to form the processing device. For example, the substrate may include one or more hotspots at which the local operational temperature is higher than surrounding portions of the substrate. Conventional designs of processing devices include mechanisms for determining temperatures at the hotspots, either through the use of sensors disposed at the hotspots or through logic that estimates the temperatures at the hotspots. The determined temperatures may be used to estimate the leakage current in a region surrounding the hotspot. However, the temperature at the hotspot is, by its nature, higher than temperatures in the surrounding areas; consequently, using the hotspot temperature to estimate the leakage current may significantly overestimate the leakage current for the region surrounding the hotspot. Overestimating the leakage current results in an underestimate of the dynamic power available to the region surrounding the hotspot, which may lead to the operating point being set unnecessarily low and limiting the performance of the processing device.

A fixed offset can be subtracted from the hotspot temperature to correct for this hotspot effect. However, the actual temperature distribution within the region surrounding the hotspot may depend on the characteristics of the workload that is being handled by the processing device. Application of a fixed offset therefore may cause thermal throttling when the workload generates temperatures that are higher than assumed by the fixed offset. For example, the actual leakage current may be higher than the assumed leakage current if the actual temperatures in the region are higher than the assumed temperature determined by the fixed offset. The power consumed by the component therefore may be higher than the available power, leading to a temperature or power overage and thermal throttling of the component, e.g., by reducing the operating point of the component. The fixed offset also may limit the performance of the processing device if the workload generates temperatures that are lower than assumed by the fixed offset. For example, the actual leakage current may be lower than the assumed leakage current if the actual temperatures in the region are lower than the assumed temperature determined by the fixed offset. The dynamic power consumed by the component therefore may be lower than the available dynamic power because the operating point of the component has been set unnecessarily low. Limiting the dynamic power consumption of the component to a level that is less than the available dynamic power may also unnecessarily limit performance of the component.

The estimate of the temperature distribution across the substrate may be improved by calculating the substrate temperature at a higher level of granularity. For example, the substrate area may be divided into smaller zones and power consumption information may be collected from each of the smaller zones. However, it typically is impracticable to implement mechanisms for gathering power consumption information at higher levels of granularity and, even if this information was available, it often is difficult, if not impossible, to convert the granular power consumption information into accurate temperature estimates for the smaller zones. The accuracy of the estimate of the leakage current therefore may be dependent on the potentially inaccurate characterization of the relation between the power consumption and the temperature in the smaller zones for a variety of different workloads. Moreover, increasing the granularity of the substrate temperature estimate may be computationally intensive and may require an on-substrate or off-substrate compute entity to perform the calculations.

FIGS. 1-5 describe embodiments of a power management controller that can dynamically adjust a temperature value used to estimate leakage currents in a processing device, which may increase the accuracy of estimates of the available dynamic power that can be consumed by the processing device. In a processing device, a "temperature overage" may occur when the operating temperature of the device exceeds a safe operating temperature. A temperature overage may be caused by a power overage that occurs when the consumed power exceeds a power threshold, e.g., when too much power is consumed at a particular location and heats the location to a temperature above the safe operating temperature. As described herein, the rate of temperature overages or the rate of power overages is a good indicator of errors in estimates of the temperature value. For example, the rate of temperature overages for a component of the processing device may increase if the temperature value is set too low because the estimated leakage current would be lower than the actual leakage current, thereby causing the power management controller to set the operating point of the component too high so that the total power consumed by the component exceeds its power budget.

Some embodiments of the power management controller can modify a temperature value associated with a region on a substrate based on a rate of temperature overages or power overages for a component associated with the region. For example, the power management controller can increase the temperature value (e.g., from a relatively low initial temperature value) in response to a rate of overages exceeding a first threshold. The power management controller can then modify an operating point of the component in response to modifications in the temperature value. For example, the power management controller may lower its estimate of the available dynamic power in response to an increase in the temperature value that indicates an increase in the leakage current. The temperature values or operating points of different components can be modified independently based on overage rates that are specific to the different components or they can be modified together based on statistical combinations of overage rates associated with the processing device.

Figure 1:
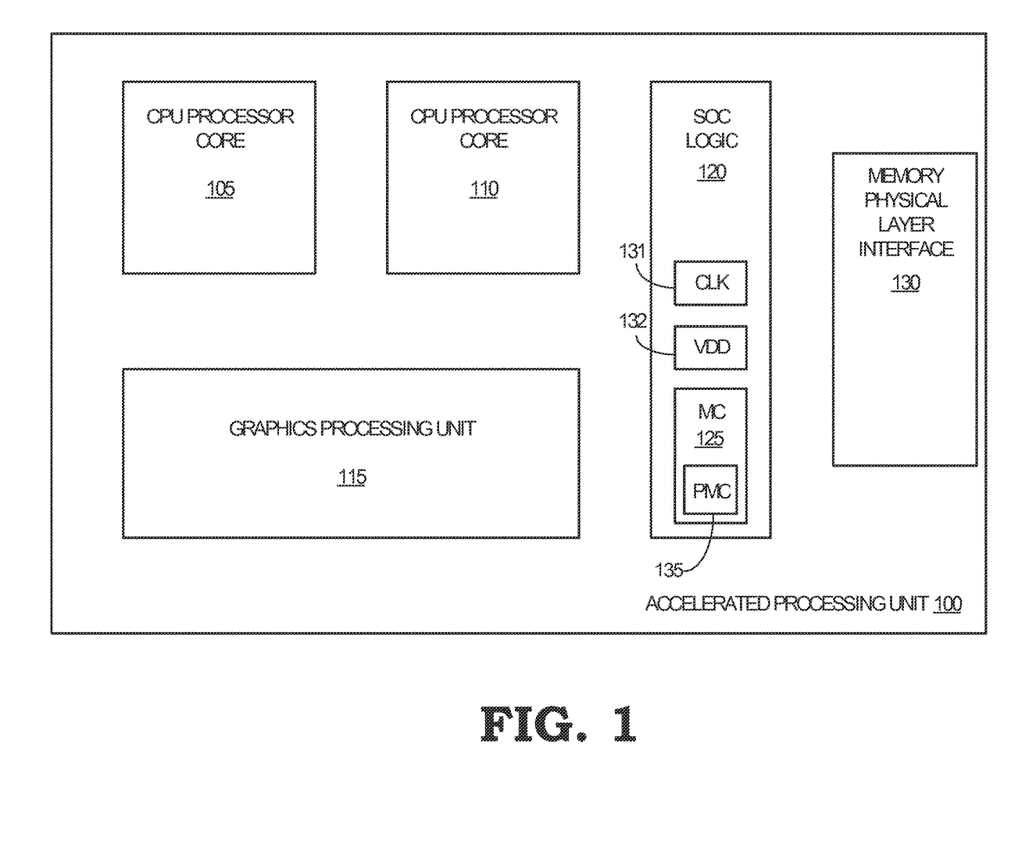
FIG. 1 is a block diagram of an accelerated processing unit (APU) that includes one or more central processing unit (CPU) processor cores and a graphics processing unit (GPU) in accordance with some embodiments.

FIG. 1 is a block diagram of an accelerated processing unit (APU) 100 that includes one or more central processing unit (CPU) processor cores 105, 110 and a graphics processing unit (GPU) 115 in accordance with some embodiments. The APU 100 may be formed on a single substrate and therefore may be referred to as an SOC. The CPU processor cores 105, 110 can execute instructions independently, concurrently, or in parallel. Although the APU 100 shown in FIG. 1 includes two CPU processor cores 105, 110, it will be appreciated that the number of processor cores in the APU 100 is a matter of design choice. Some embodiments of the APU 100 may include more or fewer than the two CPU processor cores 105, 110 shown in FIG. 1. The GPU 120 is used for creating visual images intended for output to a display. Some embodiments of the GPU 120 also may include multiple processing cores (not shown).

The processing system 100 shown in FIG. 1 also includes other SOC logic 120. Some embodiments of the SOC logic 120 may include a DMA engine (not shown) for generating addresses and initiating memory read or write cycles, for performing memory-to-memory data transfer, or for transferring data between the CPU processor cores 105 or the GPU 115. The SOC logic 120 also may include routing logic, coherency logic, or logic to implement other functionality. Some embodiments of the SOC logic 120 include a memory controller (MC) 125 to coordinate the flow of data between the APU 100 and other memory such as an external dynamic random access memory (DRAM) (not shown in FIG. 1). The memory controller 125 includes logic used to control reading information from the external memory and writing information to the external memory.

The memory controller 125 may control the operation of other memory modules using signals transmitted via a memory physical layer interface 130, which may be referred to as a "memory phy." The memory physical layer interface 130 includes the circuitry used to drive signals that govern operation of the other memory modules that may be coupled to the APU 100. For example, the memory physical layer interface 130 may provide signals that control reading, writing, refreshing, or erasing portions of a memory module such as a DRAM.

Components in the APU 100 such as the CPU processor cores 105, 110, the graphics processing unit 115, the SOC logic 120, or the memory physical layer interface 130 may be able to operate at different operating points, which may be determined by an operating clock frequency or operating voltage of the component. For example, the SOC logic 120 may include a clock 131 which provides a clock signal to govern synchronization in the component(s) and a voltage (VDD) 132 that governs the voltage used by the component(s). The operating point of one or more of the components can be modified by modifying the clock frequency or the reference voltage supplied to the component by the clock 131 or the voltage 132.

Some embodiments of the processing system 100 include a power management controller (PMC) 135 that is implemented as part of the SOC logic 120. However, the APU 100 may implement power management control in other locations or may implement distributed power management control using logic included in multiple locations such as the CPU processor cores 105, 110, the GPU 115, the SOC logic 120, or the memory physical layer interface 130. The PMC 135 may allocate power from a power budget of the APU 100 based on different performance scenarios. One criteria for allocating power to the components in the APU 100 is that the power consumed by the components should not exceed a predetermined level (e.g., the power consumed should not lead to a power overage) nor should be power consumption lead to overheating of the APU 100 (e.g., the power consumed should not lead to a temperature overage). The predetermined level that indicates a power overage may be selected to prevent a temperature overage. The power consumed by the components includes power used to operate the components and power consumed by leakage currents within the components.

The power management controller 135 may set the operating points of one or more of the components of the APU 100 so that the components are expected to consume approximately the power allocated to the component (that is, the estimated power consumption closely follows the dynamic power available to the component). For example, the power management controller 135 may estimate the power consumed by the leakage currents and subtract this from the total die power (TDP) to determine the available dynamic power for operating components in the APU 100. Portions of the available dynamic power may then be allocated to the components in the APU 100. The power management controller 135 may control the clock frequency output by the clock 131 to the components or the voltage 132 supplied to one or more of the components to adjust the operating point of the components so that the components draw approximately the portion of the available dynamic power that has been allocated to the component.

The power management controller 135 also can be used to dynamically adjust a temperature value used to estimate leakage currents in portions of the APU 100 based on a rate of temperature overages or power overages in the APU 100. For example, the power management controller 135 may increase the temperature value in response to the rate of temperature overages or power overages in the APU 100 (or in one or more of the components of the APU 100) exceeding a first threshold. The power management controller 135 also may decrease the temperature value in response to the rate of temperature overages or power overages in the APU 100 (or in one or more of the components of the APU 100) falling below a second threshold, which may be lower than the first threshold to introduce a hysteresis.

The power management controller 135 also can modify operating points of one or more of the components in the APU 100 based on a leakage current estimated using the temperature value. For example, if the temperature value is increased, the power management controller 135 also can increase its estimate of the leakage current and its estimate of the power consumed by the leakage current. The available dynamic power calculated by the power management controller 135 therefore can decrease and so the power management controller 135 can decrease the operating points of one or more of the components in the APU 100 so that these components draw less power. On the other hand, if a temperature value is decreased, the power management controller 135 can decrease its estimate of the power consumed by the leakage current. The power management controller 135 therefore can increase its estimate of the available dynamic power and increase the operating points of one or more of the components in the APU 100 so that these components draw more power, thereby increasing performance.

Some embodiments of the power management controller 135 can estimate temperature values at higher or lower levels of granularity than the component-level of granularity described herein. For example, the power management controller 135 may estimate temperature values within portions of a component such as the CPU processor core 105. The power management controller 135 therefore may be able to estimate the leakage current in each of the portions of the CPU processor core 105 and independently control the operating points of these portions based on the estimated leakage current. As another example, the power management controller 135 may estimate a single temperature value for the APU 100 and use this temperature value to set the operating point for the APU 100 or for one or more of the components within the APU 100.

Figure 2:
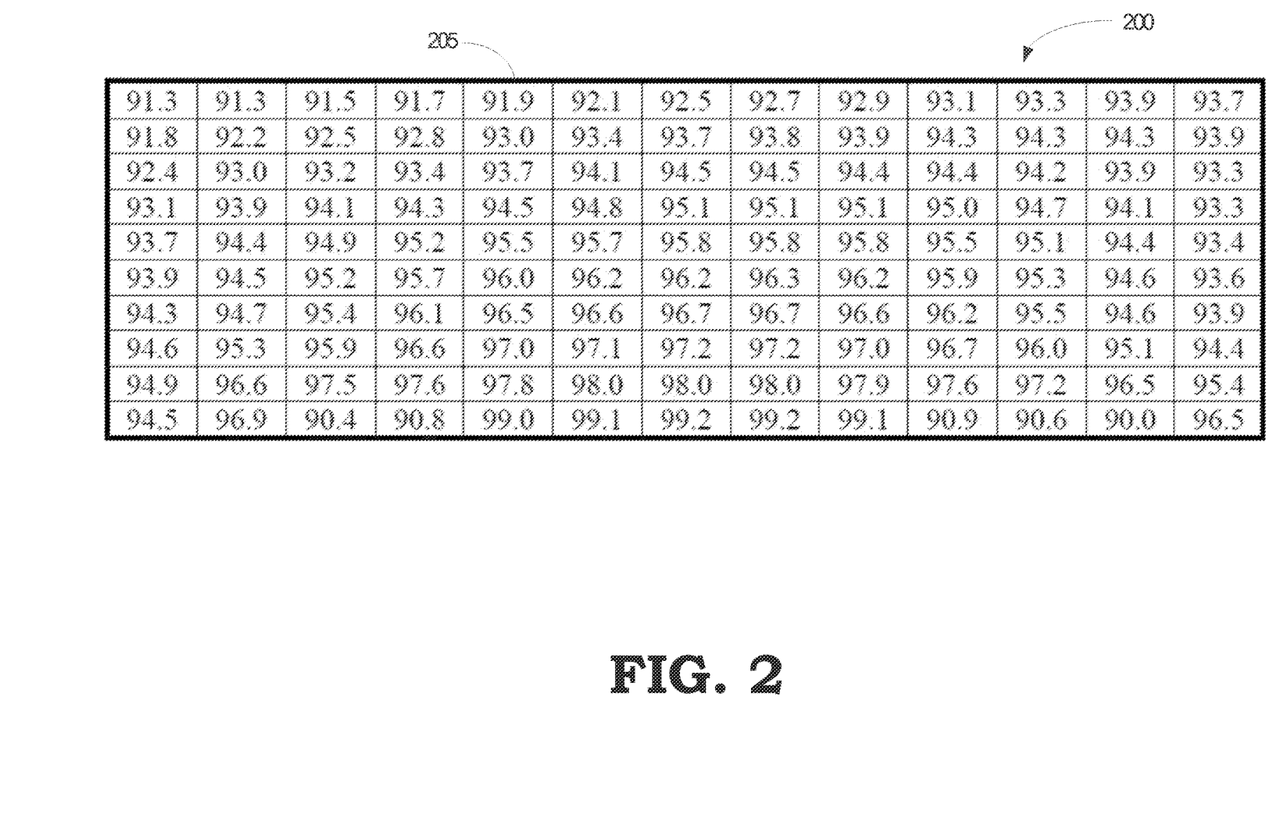
FIG. 2 shows a representation of temperatures distributed across a substrate implementing an APU in accordance with some embodiments.

FIG. 2 shows a representation of temperatures distributed across a substrate 200 in accordance with some embodiments. The substrate 200 is divided into multiple regions 205 (only one indicated by a reference numeral in the interest of clarity) and each of the regions 205 includes a sensor for measuring a temperature in the region 205 or logic for calculating the temperature in the region 205, e.g., using measures of the power supplied to the region 205. The temperatures in the regions 205 range from a high of 99.2° C. (at the bottom center of the substrate 200) to a low of 91.3° C. (at the upper left of the substrate 200). Due to the strong temperature dependence of the leakage current on temperature, leakage currents from the regions 205 would be overestimated if the leakage current was estimated using the temperature of the hotspot (e.g., a temperature of 99.2° C.).

Figure 3:
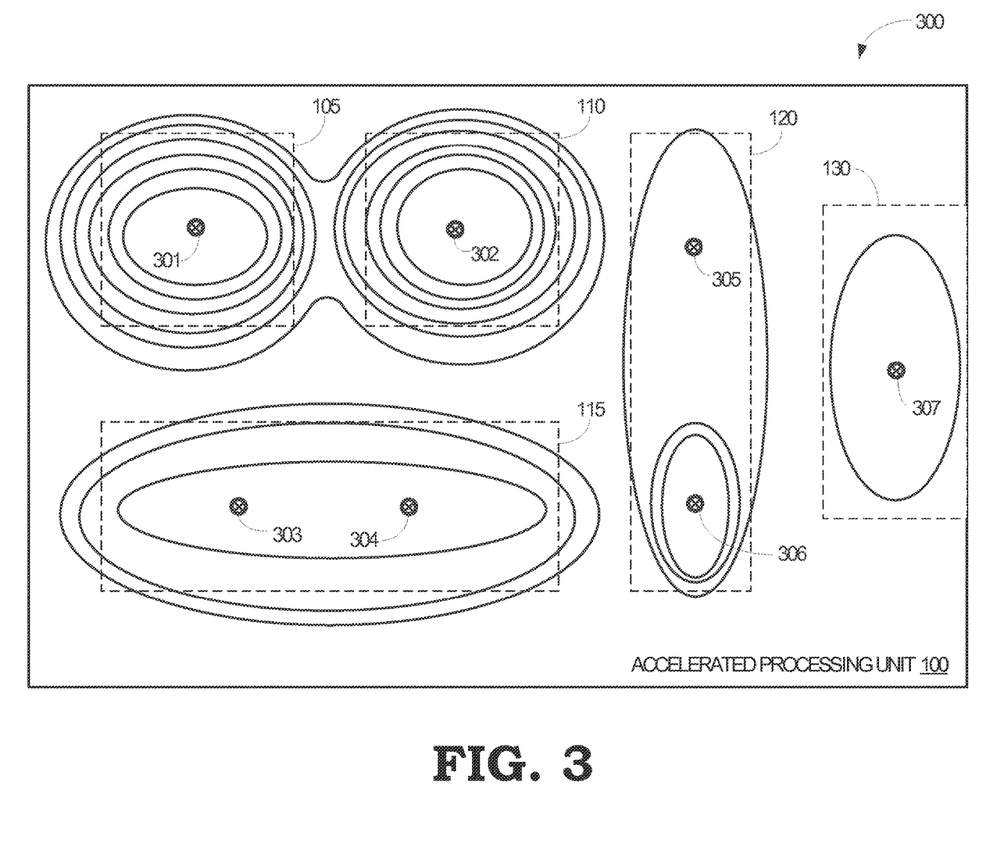
FIG. 3 is an example contour plot of temperature across a surface of the APU shown in FIG. 1 during a compute-intensive workload in accordance with some embodiments.

FIG. 3 is an example contour plot 300 of temperature across the surface of the APU 100 shown in FIG. 1 during a compute-intensive workload in accordance with some embodiments. The dashed lines indicate the locations of the CPU processor cores 105, 110, the GPU 115, the SOC logic 120, and the physical layer interface 130 shown in FIG. 1. Each contour in the contour plot shown in FIG. 3 corresponds to a different temperature and the contours are separated by a fixed temperature interval such as 1° C. Potential hotspots may occur in the CPU processor cores 105, 110, the GPU 115, the SOC logic 120, and the physical layer interface 130. Accordingly, the APU 100 includes temperature sensors or logic for estimating the temperature at locations 301-307 distributed across the substrate that supports the APU 100.

In operation, the APU 100 as shown in FIG. 3 is handling a compute-intensive workload and so the CPU processor cores 105, 110 are processing more instructions or performing more operations than other components within the APU 100. For example, the CPU processor cores 105, 110 may be operating at 50% of capacity while the GPU 115 is operating at 1% of capacity. The difference in the workloads leads to a difference in the operating temperature of the CPU processor cores 105, 110 and the GPU 115, as indicated by the higher density of contours overlapping with the CPU processor cores 105, 110. Leakage currents in the CPU processor cores 105, 110 therefore may be significantly larger than leakage currents in the GPU 115. The power management controller 135 (FIG. 1) may increase a temperature value used to estimate leakage currents in the CPU processor cores 105, 110. In some embodiments, the power management controller 135 also may decrease the temperature value used to estimate leakage currents in the GPU 115.

The changes in the temperature values used to calculate leakage currents may result in modifications to the operating points of the CPU processor cores 105, 110 or the GPU 115. For example, decreasing the temperature value used to estimate leakage currents in the GPU 115 decreases the estimated leakage currents in the GPU 115 and increases estimates of the available dynamic power. For another example, increasing the temperature value used to estimate leakage currents in the CPU processor cores 105, 110 increases the estimated leakage currents in the CPU processor cores 105, 110 and decreases estimates of the available dynamic power. In some embodiments, the operating point of the CPU processor cores 105, 110 may be increased to support the compute-intensive load by allocating dynamic power made available by decreasing the operating point of the GPU 115 to the CPU processor cores 105, 110.

Figure 4:
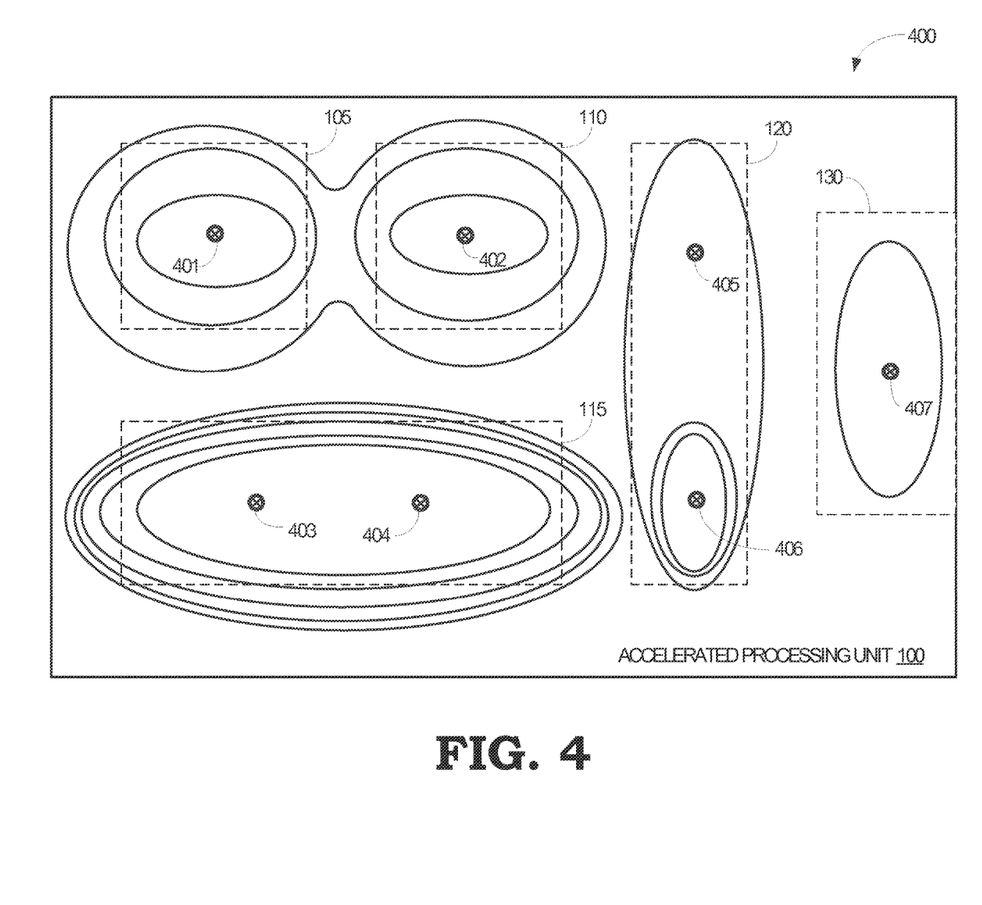
FIG. 4 is an example contour plot of temperature across a surface of the APU shown in FIG. 1 during a graphics-intensive workload in accordance with some embodiments.

FIG. 4 is an example contour plot 400 of temperature across a surface of the APU 100 shown in FIG. 1 during a graphics-intensive workload in accordance with some embodiments. The dashed lines indicate the locations of the CPU processor cores 105, 110, the GPU 115, the SOC logic 120, and the physical layer interface 130 shown in FIG. 1. Each contour in the contour plot 400 shown in FIG. 4 corresponds to a different temperature and the contours are separated by a fixed temperature interval such as 1° C. Potential hotspots may occur in the CPU processor cores 105, 110, the GPU 115, the SOC logic 120, and the physical layer interface 130 and so the APU 100 includes temperature sensors or logic for estimating the temperature at locations 401-407 distributed across the substrate that supports the APU 100.

In operation, the APU 100 shown in FIG. 4 is handling a graphics-intensive workload and so the CPU processor cores 105, 110 are processing fewer instructions or performing fewer operations than the GPU 115. For example, the CPU processor cores 105, 110 may be operating at 1% of capacity while the GPU 115 is operating at 50% of capacity. The difference in the workloads leads to a difference in the operating temperature of the CPU processor cores 105, 110 and the GPU 115, as indicated by the higher density of contours overlapping with the GPU 115. Leakage currents in the GPU 115 therefore may be significantly larger than leakage currents in the CPU processor cores 105, 110. A power management controller (not shown in FIG. 4) therefore may increase a temperature value used to estimate leakage currents in the GPU 115. In some embodiments, the power management controller also may decrease the temperature value used to estimate leakage currents in the CPU processor cores 105, 110.

The changes in the temperature values used to estimate leakage currents in the CPU processor cores 105, 110 or the GPU 115 may result in modifications to the operating points of the CPU processor cores 105, 110 or the GPU 115. For example, increasing the temperature value used to estimate leakage currents in the GPU 115 may increase the estimated leakage currents in the GPU 115 and decrease estimates of the available dynamic power. For another example, decreasing the temperature values used to estimate leakage currents in the CPU processor cores 105, 110 decreases the estimated leakage currents in the CPU processor cores 105, 110 and increases estimates of the available dynamic power. In some embodiments, the additional dynamic power freed up by decreasing the operating point of one or more of the CPU processor cores 105, 110 may be allocated to the GPU 115 to increase its operating point to support the graphics-intensive workload.

Figure 5:
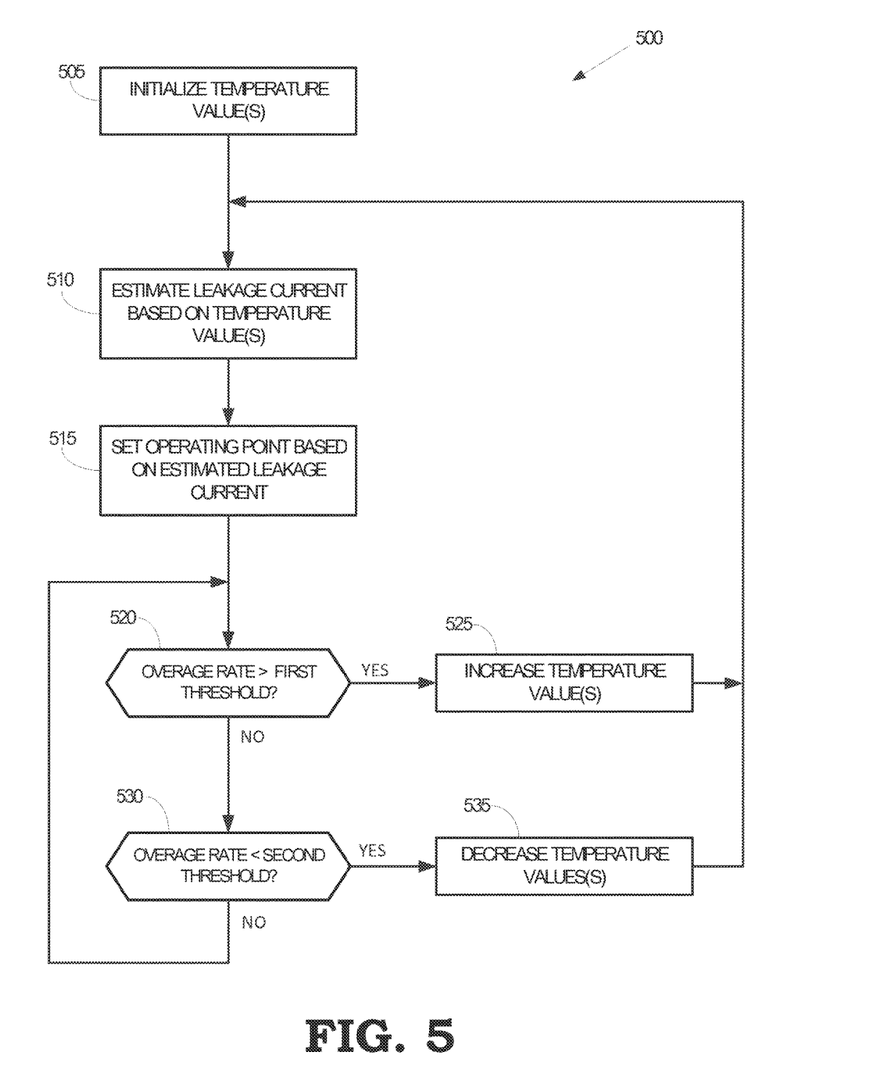
FIG. 5 is a flow diagram of a method for dynamically adjusting temperature values used to estimate leakage currents in portions of a system-on-a-chip (SOC) such as the APU shown in FIG. 1 in accordance with some embodiments.

FIG. 5 is a flow diagram of a method 500 for adjusting one or more operating points of an SOC, such as the APU 100 shown in FIG. 1, based on dynamically adjusted temperature values used to estimate leakage currents in portions of the SOC in accordance with some embodiments. Some embodiments of the method 500 may be implemented in a power management controller such as the power management controller 135 shown in FIG. 1. At block 505, the power management controller 135 initializes one or more temperature values that may be used to estimate leakage currents in corresponding portions of the SOC. For example, the power management controller 135 may initialize temperature values that are used to estimate leakage currents in the CPU processor cores 105, 110 and the GPU 115. The initial temperature may represent an average temperature across a given substrate area for several common workloads (e.g., ~85° C.).

At block 510, the power management controller 135 estimates one or more leakage currents based on the temperature values. Some embodiments of the power management controller may estimate the leakage current using modeling, empirical values, theoretical values or other representations of the relationship between temperature and leakage current. For example, the power management controller 135 may estimate the leakage current $I_{LEAK}$ using a temperature value $T_{CHAR}$ and the formula:

$$I_{LEAK} = f(T_{CHAR}).$$

The function $f(\ )$ may be a weighted function, a polynomial function, a tabulated function stored in a look up table, or another type of function that is used to model the relationship between the leakage current and the temperature value. At block 515, the power management controller sets one or more operating points of components of the SOC based on the estimated leakage current, as described herein.

The power management controller 135 may then dynamically adjust the temperature values or the operating points of components in the SOC. For example, the power management controller 135 may change the temperature value to a new temperature value or may apply a weight or scaling factor to the initial temperature value. Some embodiments of the power management controller 135 may monitor one or more overage rates associated with the SOC. For example, the power management controller may monitor temperature overages or power overages associated with components of the SOC. An overage rate can then be calculated using the number of overages detected during a given time interval or using a moving average in a moving window of time. A large overage rate may indicate that one or more temperature values have been set too low so that the power consumption by leakage currents has been underestimated, which may lead to setting the operating point of one or more components too high. Thus, one or more temperature values may be increased at block 525 if the overage rate exceeds a first threshold at decision block 520. For example, the power management controller 135 may increase the temperature value by a configurable step value such as 0.1° C. The power management controller may then estimate the leakage current and set the operating points based on the increased temperature values at block 510 and 515 and the method 500 may continue.

If the overage rate does not exceed the first threshold at decision block 520, the power management controller 135 may determine whether the overage rate is less than a second threshold at decision block 530. In some embodiments, the second threshold may be lower than the first threshold to introduce a hysteresis. The power management controller may continue monitoring the overage rates as long as the overage rate is above the second threshold. A small overage rate may indicate that one or more temperature values have been set too high so that power consumption by leakage currents has been overestimated, which may unnecessarily reduce performance of the SOC because the operating points may be set too low to consume all of the available dynamic power. One or more of the temperature values therefore may be decreased at block 535. For example, the power management controller may decrease the temperature value by a configurable step value such as 0.1° C. The power management controller 135 may then estimate the leakage current and set the operating points based on the decreased temperature values at block 510 and 515 and the method 500 may continue.

Figure 6:
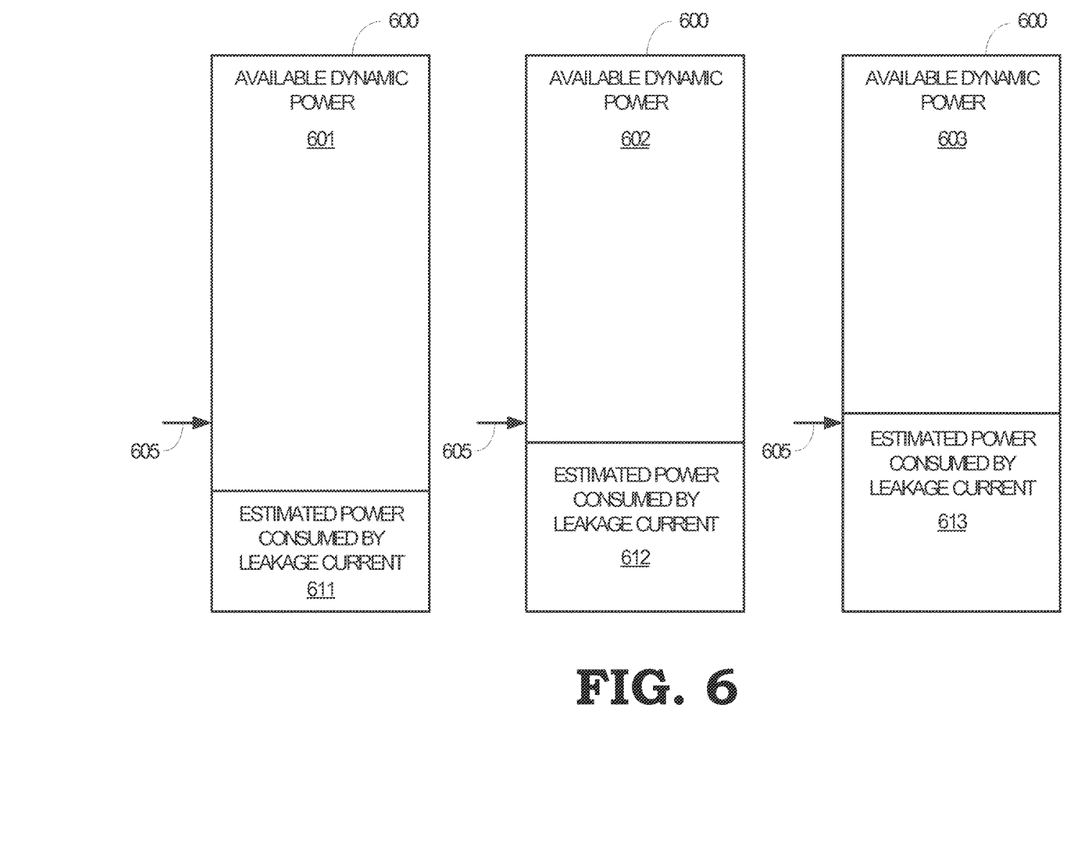
FIG. 6 is a diagram showing changes to estimates of the available dynamic power that occur in response to changes in the temperature values used to estimate leakage current in accordance with some embodiments.

FIG. 6 is a diagram showing changes to estimates of the available dynamic power 601, 602, and 603 that occur in response to changes in the temperature values used to estimate leakage current in accordance with some embodiments. The changes illustrated in FIG. 6 may result from performing embodiments of the method 500. The box 600 indicates a power budget such as a TDP of an SOC and in the example shown in FIG. 6 the TDP remains constant. The actual power consumed by leakage currents at the actual temperature of the SOC is indicated by the arrow 605. Initially, the temperature value used to estimate leakage currents is set to a relatively low value, as described herein. The low temperature value indicates a low estimated power consumed by leakage currents 611 and an overestimate of the available dynamic power 601. Persons of ordinary skill in the art having benefit of the present disclosure should appreciate that the ratios of the available dynamic power 601-603 to the estimated power consumed by leakage currents 611, 612, and 613 shown in FIG. 6 are intended to be illustrative and actual ratios may differ from the illustrated ratios.

The operating point of the SOC may be set too high because of the low initial temperature value and may consume too much power, leading to temperature overages or power overages. The power management controller therefore may increase the temperature value so that the estimated power consumed by leakage current 612 increases. The estimate of the available dynamic power 602 is therefore reduced relative to the available dynamic power 601. However, in this example, the estimate of the available dynamic power 602 is still an overestimate and so the operating point of the SOC therefore may be set too high and may consume too much power, leading to temperature overages or power overages. In the next iteration, the power management controller again increases the temperature value so that the estimated power consumed by leakage current 613 increases. The estimate of the available dynamic power 603 is therefore reduced relative to the available dynamic power 602. At this point, the estimated power consumed by leakage current 613 a slightly larger than the actual power consumed by leakage current, as indicated by arrow 605. The estimate of the available dynamic power 603 is therefore substantially accurate and so the rate of temperature overages or power overages may remain in an acceptable range.

In some embodiments, the apparatus and techniques described above are implemented in a system comprising one or more integrated circuit (IC) devices (also referred to as integrated circuit packages or microchips), such as the power management controller described above with reference to FIGS. 1-6. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 7:
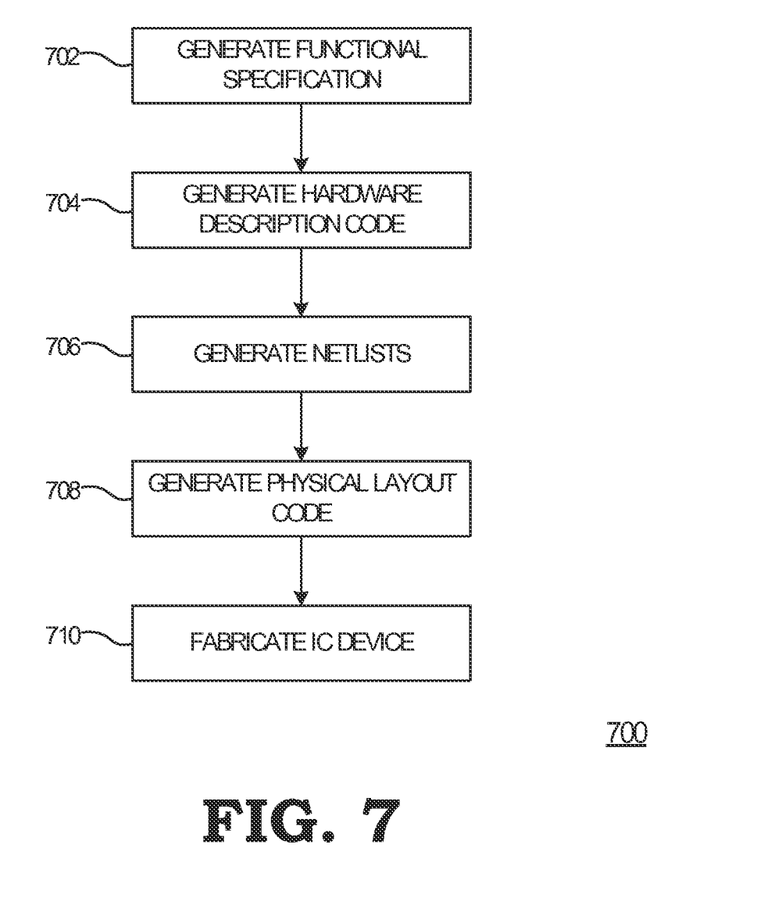
FIG. 7 is a flow diagram illustrating a method for designing and fabricating an integrated circuit device implementing at least a portion of a component of a processing device in accordance with some embodiments.

FIG. 7 is a flow diagram illustrating an example method 500 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 702 a functional specification for the IC device is generated. The functional specification (often referred to as a micro architecture specification (MAS)) may be represented by any of a variety of programming languages or modeling languages, including C, C++, SystemC, Simulink, or MATLAB.

At block 704, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, System Verilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 706 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 708, one or more EDA tools use the netlists produced at block 706 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the device. The code may be represented in a database file format, such as, for example, the Graphic Database System II (GDSII) format. Data in this format typically represents geometric shapes, text labels, and other information about the circuit layout in hierarchical form.

At block 710, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
   setting an operating point of at least one component in a processing device by estimating a leakage current based on a rate of overages for the at least one component,
   wherein the rate of overages is at least one of a rate of temperature overages or a rate of power overages for the at least one component, and
   wherein the operating point is at least one of an operating frequency or an operating voltage.

2. The method of claim 1, wherein the rate of overages is determined by at least one of calculating a number of overages detected during a given time interval or calculating a moving average of the rate of overages in a moving window of time of the at least one component.

3. The method of claim 1, wherein estimating the leakage current further comprises selecting a temperature value based on the rate of overages.

4. The method of claim 3, wherein the selected temperature value is increased in response to the rate of overages exceeding a first threshold.

5. The method of claim 4, wherein setting the operating point of said at least one component comprises reducing at least one of an operating frequency or an operating voltage of said at least one component in response to increasing the selected temperature value.

6. The method of claim 4, wherein the selected temperature value is decreased in response to the rate of temperature overages or the rate of power overages falling below a second threshold.

7. The method of claim 6, further comprising modifying the operating point of the at least one component comprises by increasing at least one of the operating frequency or the operating voltage of the at least one component in response to decreasing the selected temperature value.

8. The method of claim 6, wherein the second threshold is less than the first threshold.

9. The method of claim 6, further comprising monitoring the rate of overages as long as the rate of temperature overages or the rate of power overages is above the second threshold.

10. A processing device, comprising:
    a power management controller setting an operating point of at least one component in the processing device by estimating a leakage current based on a rate of overages for the at least one component, wherein the rate of overages is at least one of a rate of temperature overages or a rate of power overages for the at least one component, and wherein the operating point is at least one of an operating frequency or an operating voltage.

11. The processing device of claim 10, wherein the power management controller determines the rate of overages by at least one of calculating a number of overages detected during a given time interval or calculating a moving window of time of the the least one component.

12. The processing device of claim 10, wherein the power management controller estimates the leakage current by selecting a temperature value based on the rate of overages.

13. The processing device of claim 12, further comprising: the power management controller increasing the selected temperature value in response to the rate of overages exceeding a first threshold.

14. The processing device of claim 13, further comprising: the power management controller reducing at least one of the operating frequency or the operating voltage of said at least one component in response to increasing the selected temperature value.

15. The processing device of claim 13, further comprising: the power management controller decreasing the selected temperature value in response to the rate of temperature overages or the rate of power overages falling below a second threshold.

16. The processing device of claim 15, further comprising:

the power management controller increasing at least one of the operating frequency or the operating voltage of the at least one component in response to decreasing the selected temperature value.

17. The processing device of claim 15, wherein the second threshold is less than the first threshold.

18. The processing device of claim 15, further comprising:

the power management controller monitoring the rate of overages as long as the rate of temperature overages or the rate of power overages is above the second threshold.

* * * * *